(12) United States Patent
Keidl et al.

(10) Patent No.: US 6,191,954 B1
(45) Date of Patent: Feb. 20, 2001

(54) CONTROLLED LOW IMPEDANCE HIGH CURRENT CIRCUIT BOARD INTERCONNECT

(75) Inventors: Steven Dennis Keidl, Rochester; Gary Allen Thompson, Pine Island, both of MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/193,328

(22) Filed: Nov. 16, 1998

(51) Int. Cl.[7] ............................... H05K 1/14; H01B 17/00
(52) U.S. Cl. .................... 361/803; 361/799; 361/807; 174/138 G; 439/591; 333/12
(58) Field of Search ................................. 361/742, 803, 361/804, 807, 799; 174/137 R, 138 G, 267; 439/65, 68, 591, 631, 632; 333/12, 32

(56) References Cited

U.S. PATENT DOCUMENTS

| | | | | |
|---|---|---|---|---|
| 4,760,495 | * | 7/1988 | Till | 361/804 |
| 5,008,777 | * | 4/1991 | Burns | 361/804 |
| 5,479,320 | * | 12/1995 | Estes et al. | 361/785 |
| 5,825,633 | * | 10/1998 | Bujalski et al. | 361/804 |
| 5,928,000 | * | 7/1999 | Rudisill et al. | 439/63 |
| 6,038,140 | * | 3/2000 | Petri | 361/804 |

* cited by examiner

Primary Examiner—Jayprakash N. Gandhi
(74) Attorney, Agent, or Firm—Felsman, Bradley, Vaden, Gunter & Dillon, LLP

(57) ABSTRACT

An apparatus for electrically interconnecting circuit boards and providing controlled low impedance current paths. A first conductive member has a first surface, a second surface and a third planar surface, the first surface attaches to a first circuit board or CIM and the second surface attaches to a second circuit board or CIM. An insulative sheet having dielectric properties is aligned parallel to the third surface of the first conductive member. A second conductive member has a fourth surface, a fifth surface and a sixth planar surface, the fourth surface connects to the first circuit board and the fifth surface is for attaching to the second CIM. The sixth planar surface is aligned parallel to the insulative sheet, such that a controlled low impedance high current interconnect can be achieved between the first CIM and the second circuit board responsive to the dielectric properties of the insulative sheet.

25 Claims, 2 Drawing Sheets

CONTROLLED LOW IMPEDANCE HIGH CURRENT CIRCUIT BOARD INTERCONNECT

BACKGROUND OF THE INVENTION

1. Technical Field

The present invention relates in general to a compact, reliable, universal power distribution system and in particular to a power distribution system which incorporates surface mount technology in the manufacturing process. Still more particularly, the present invention relates to a controlled low impedance transmission line providing a high current capacity between a power supply module or a power supply circuit board and a digital signal processing module or a logic circuit board.

2. Description of the Related Art

Computer technology development has continually produced smaller and more compact data processing systems. State-of-the-art circuits now utilize low voltages to power digital logic circuits. A low voltage standard for digital logic which is gaining popularity is the 1.5 volt standard. However, power consumption has not declined with lower voltage standards. Unchanging power requirements in conjunction with low voltage standards mandates very high electrical currents.

For example, the power consumption of 10 amps at 12 volts is equivalent to the power consumption of 80 amps at 1.5v. Increased amperage requires the implementation of low impedance paths to distribute power because the resistive losses inherent in smaller conductors are prohibitive. These losses can produce unwanted heating which promotes component failure in computer systems.

Nearly all power supplies in today's computers are "switch-mode" power supplies. Switch-mode power supplies rapidly switch to chop the input voltage thus transferring a percentage of the input voltage to an output port. The output port is then filtered to average the output voltage, thereby stepping the input voltage down and producing a DC output. A switch-mode power supply regulates the stepped down voltage at its output port utilizing feedback loops. Losses due to the reactive characteristics of printed circuit traces and connectors can cause system malfunctions.

Further, the performance of switch-mode power supplies operating at high frequencies is degraded when the power transmission lines interconnecting a load such as a digital logic circuit becomes inductive. Inductive power transmission lines are particularly undesirable when high currents are present. Power transmission line inductance values which exceed one nanohenry can cause inefficiencies in power distribution performance.

Often, two component interconnect modules such as printed circuit boards (PCBs) or multi-chip modules require interconnection in close proximity. For example, in high density computer systems it is desirable to mount a power supply circuit board and a digital signal processing circuit board parallel to each other in close proximity.

"Pins" may be utilized between the power supply circuit board and the circuit board containing the data processing hardware to provide power to the data processing circuit board. A pin interconnect can create an inductance of 10 to 20 nanohenries and a capacitance of one picofarad on the interconnect line between the circuit boards. Additionally, relatively high resistances can be encountered. It would be desirable to reduce the inductance between circuit boards to less than a nanohenry.

Pin interconnects also provide minimal capacitance. For high currents, capacitance is desirable to reduce the ripple voltage on the output of the switch-mode power supply.

In radio frequency designs, transmission lines for radio signals are often implemented utilizing a "microstrip" configuration. A microstrip is a conductor separate from a ground plane utilizing an insulator made from a dielectric material. Microstrip designs allow the designer to accurately control the impedance of the transmission line. However, due to low current, radio frequency designs utilize feed through capacitors and do not utilize a microstrip configuration when interconnecting two circuit boards.

Generally, the interconnection of power distribution systems to digital logic circuits has not received the same amount of attention which other components of computer systems have. Power systems are necessary and an integral part of computer systems. Many power distribution systems utilize cables to interconnect power supplies to digital circuit boards.

Current computer construction techniques for power supplies require the assembly of cables and connectors. Hand soldering and/or hand crimping is required in almost every cable assembly which interfaces power sources to circuit boards, hard drives and other peripheral devices. Cabling requirements are costly and assembly is normally done by outside contractors who specialize in wire harnesses. Utilizing outside contractors and vendors requires purchasing effort, quality control, inspection and additional part numbers.

Pins and specifically square pins often require manual labor to insert the pins into a circuit board. Further, square pins generally require manual labor to hand solder the square pins to the printed circuit board. This problem arises because bulk soldering processes have a saw which cuts off excess component lead length and thus square pins would be cut off if soldered in a bulk soldering process. Both manual insertion and hand soldering are very labor intensive.

Hand soldering square pins also can create reliability problems. Specifically, quality control procedures to ensure quality in manual operations such as hand soldering, is an entire process in itself. It would be preferred to provide an automated soldering process to achieve power supply to digital circuitry power system interconnection.

Finally, current power interconnect designs require human labor to individually, electrically and mechanically connect power supplies to a system. All of the foregoing tasks add to the assembly costs of computer systems, and in particular add to the cost of final assembly of a computer system.

Circuit board manufacturing considerations such as tolerances related to the density of "through hole" and "trace" fabrication, prohibit high trace density. Hence, lengthy power busses are required on CIMs or in cable runs. Problems arise when power distribution lines having an uncontrolled impedance are utilized where low voltage digital technology is supplied by a switch-mode power supply. A small voltage drop in a low voltage power distribution system equates into a large percentage of voltage loss.

To reduce the overall size of electronics and distribution loss, designers have attempted to place digital logic circuits in close proximity to switching power supplies. However, high inductive and resistive impedance between switching power supplies and signal processing circuit boards has been a significant design problem.

Circuit boards or CIMs containing power distribution circuits can radiate electronic noise which originates from switch-mode power supplies. Most switch-mode power supplies operate at a determined frequency. When the length of the interconnecting transmission line reaches a fraction of the wavelength predetermined by the switching frequency, the power transmission line can act as an antenna. Radiating noise can interfere with low voltage digital logic circuits, this is particularly true when inductive or capacitive coupling occurs. Power transmission lines are present in every chip and circuit board and virtually everywhere in a computer system.

A power interconnect system which interconnects two circuit boards or CIMs and can accommodate high currents at low impedance would be both desirable and advantageous. Hence, there is a need for a low cost, high density and reliable power interconnect system having a controllable impedance. The present invention is directed at reducing the cost and size of power interconnect systems while solving reliability problems and accommodating high currents with a low impedance.

SUMMARY OF THE INVENTION

It is therefore one object of the present invention to provide a compact, reliable, universal power distribution system.

It is another object of the present invention to provide controlled low impedance, high current interconnect lines between power supply circuit boards or a power supply component interconnect module (CIM) and a digital signal processing circuit board or a logic CIM.

It is yet another object of the present invention to provide a power distribution system which allows surface mount fabrication and incorporates automation in the manufacturing process.

The foregoing objects are achieved as is now described. An apparatus for electrically interconnecting circuit boards and providing controlled low impedance high current circuit board interconnect is disclosed. A first conductive member has a first surface, a second surface and a third planar surface, the first surface attaches to a first circuit board or CIM and the second surface attaches to a second circuit board or CIM. An insulative sheet having dielectric properties is aligned parallel with the third surface of the first conductive member. A second conductive member has a fourth surface, a fifth surface and a sixth planar surface, the fourth surface connects to the first CIM and the fifth surface is for attaching to the second CIM. The sixth planar surface is aligned parallel with the insulative sheet, opposite the third planar surface, such that a controlled impedance interconnect can be achieved between the first CIM and the second CIM responsive to the dielectric properties of the insulative sheet.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
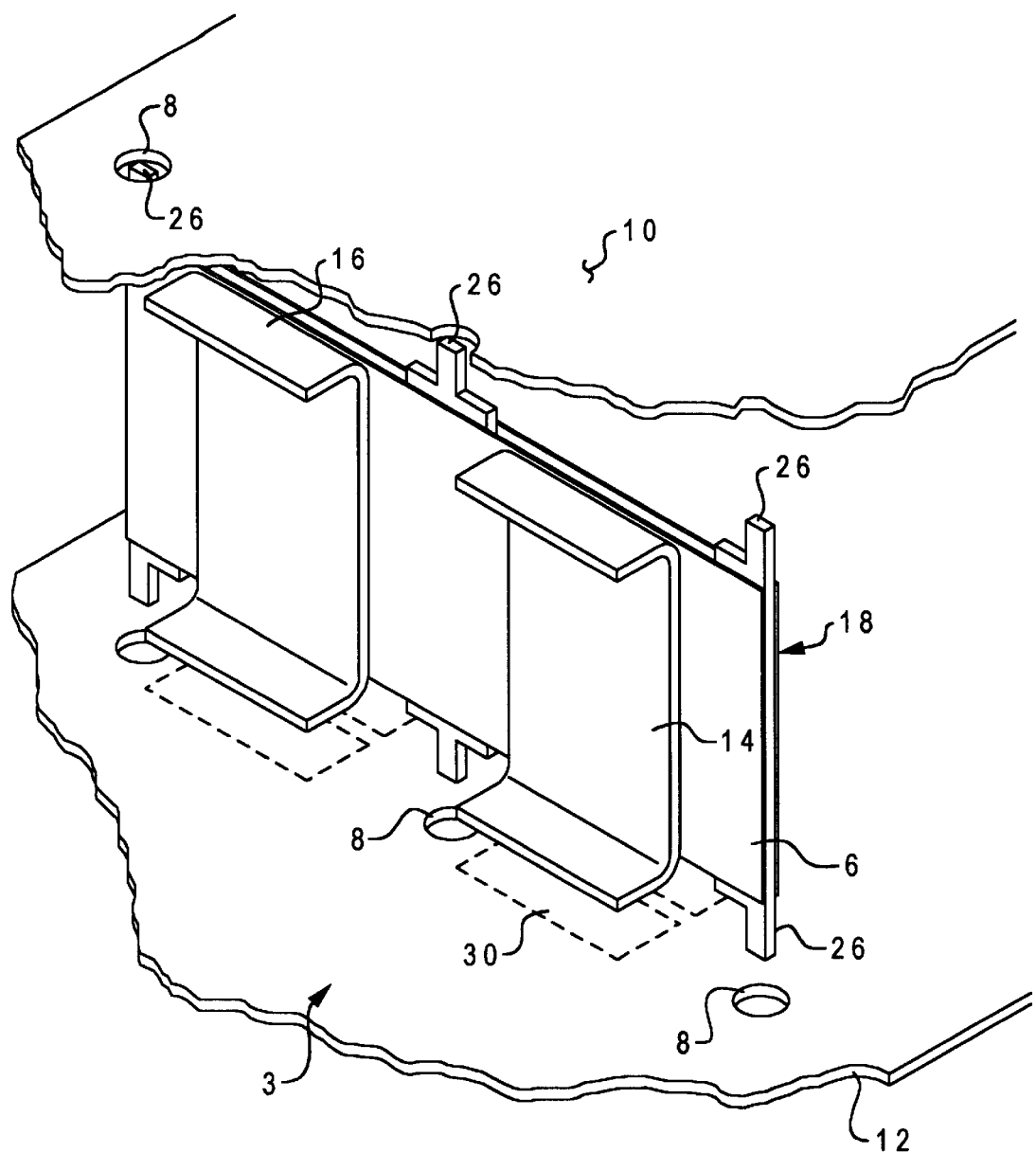
FIG. 1 is a perspective view of one embodiment of a low impedance high current power distribution interconnect in accordance with the present invention.

With reference now to the figures and in particular with reference to FIG. 1, a perspective view of one embodiment of a low impedance high current interconnect 3 for a power distribution system constructed in accordance with the present invention is depicted. In the illustrated embodiment, low impedance high current interconnect 3 is generally comprised of conductive structure 18, first conductor 14, possibly a second conductor 16 and first insulator 6.

First Component Interconnect Module (CIM) 10 is displaced above second CIM 12 by conductive structure 18. A CIM can be a printed circuit board, a multi-chip module or any other method or hardware for electrically interconnecting a collection of electrical devices. Other possible CIM structures and materials for interconnecting electrical components include but are not limited to ceramic substrates, Alumina substrates or commercially available products such as Thermal Clad®.

Tabs 26 of conductive structure 18 are inserted into a plurality of plated through-holes 8 in first CIM 10 and second CIM 12. Conductive structure 18 provides a ground path or common connection for currents which flow to a power supply utilizing conductive structure 18.

First conductor 14 supplies a specified voltage between first CIM 10 and second CIM 12. It is required that the cross sectional area of copper in first conductor 14 is sufficient to accommodate the current flowing between first CIM 10 and second CIM 12 on first conductor 14 without producing excessive heat due to the resistive properties of first conductor 14.

First insulator 6 can be affixed to conductive structure 18 utilizing an adhesive or covering which can withstand soldering temperatures of up to 600 degrees fahrenheit as a first step of the assembly process. The process of securing first insulator 6 to conductive structure 18 and first conductor 14 can be accomplished by coating first insulator with an adhesive and utilizing pressure and heat to ensure adequate adhesion. After a conductor is soldered to first CIM 10 and second CIM 12, first insulator 6 is retained between conductive structure 18 and a first conductor 14.

It is preferred that conductive structure 18 is manufactured utilizing a copper alloy material. Alternate embodiments provide any material which can be effectively soldered, such as a bronze or silver alloy, provided that the material utilized has a low resistivity.

In a preferred embodiment, tabs 26 on conductive structure 18 are soldered into plated through-holes 8 such that electrical continuity is maintained between plated through holes 8 in first CIM 10 and plated through-holes 8 in second CIM 12. Plated through holes 8 are typically interconnected to a ground plane (not shown) within first CIM 10 and second CIM 12.

First insulator 6 is placed substantially parallel to and adjacent to conductive structure 18 such that first conductor 14 and second conductor 16 can be placed in close proximity and parallel to conductive structure 18. First insulator 6 is held in direct contact with conductive structure 18, first conductor 14 and second conductor 16 utilizing the noted adhesive. Controlling the proximity of first insulator 6 to first conductor 14 and conductive structure 18 determines, in part, the impedance of low impedance high current interconnect 3.

First insulator 6 also prevents first conductor 14 and second conductor 16 from contacting and shorting to conductive structure 18. First insulator 6 can be manufactured from Kapton™, Teflon™ or any other insulative material. The thickness and dielectric properties of first insulator 6 dictate, in part the low impedance of the high current interconnect formed between first CIM 10 and second CIM 12. An insulator with a high dielectric constant provides the best performance for power transmission. In the embodiment depicted, the higher the dielectric constant of the insulator utilized, the higher the capacitance of the transmission line. An insulator having a dielectric constant of nine and a thickness of two or three thousands of an inch preforms well in the present invention.

A high dielectric constant insulator can reduce the impedance of the transmission line to a very low value. Additionally, an insulator having a high dielectric constant value can enhance the capacitance of the transmission line. The impedance of a transmission line configured in accordance with the present invention can be controlled by the selection of materials and the distance separating conductive structure 18 from first conductor 14 and second conductor 16.

The transmission lines of the present invention have the basic electrical properties which can be described by microstrip equations similar to those utilized in radio frequency transmission line designs. Microstrip designs and their corresponding equations are well known by those skilled in the art and will not be discussed herein.

Conductive structure 18 can traverse the entire length or width of first CIM 10 and second CIM 12. Alternately, a series of short conductive structures can be placed on a circuit board. A honeycomb or lattice structure implemented by conductive structure 18 could also be utilized between first CIM :LO and second CIM 12. If a sufficient quantity of conductive structures are utilized in strategic locations, conductive structures could provide all of the mechanical support required between two CIMs. A honeycomb structure would allow hundreds of transmission lines to be manufactured between circuit boards simultaneously by an automated soldering process.

Additionally, conductors could be placed on each side of conductive structure 18. Second CIM 12 has surface mount pads 30 for securing first conductor 14 and second conductor 16 to second CIM 12. Surface mount pads also exist directly above surface mount pads 30 on first CIM 10 to secure the top surface of first conductor 14 and the top surface of second conductor 16 to first CIM 10.

The process of surface mounting components to surface mount pads is well known by those having skill in the art. Surface mount soldering processes include vapor phase soldering, infra red, hot vapor, and wave soldering. When a bulk soldering process is utilized to solder the present invention, the surface tension of the liquified solder aligns top surface of first conductor 14 to surface mount pads 30 and the corresponding surface mount pad on first CIM 10 to the bottom surface of first conductor 14.

The present invention also provides additional enhancements for an operational CIM assembly. If first CIM 10 has a coefficient of thermal expansion which significantly exceeds the coefficient of thermal expansion for second CIM 12, the low impedance high current interconnect of the present invention can lean or skew from the vertical position illustrated and not adversely effect the critical electrical or mechanical properties of the invention.

Figure 2:
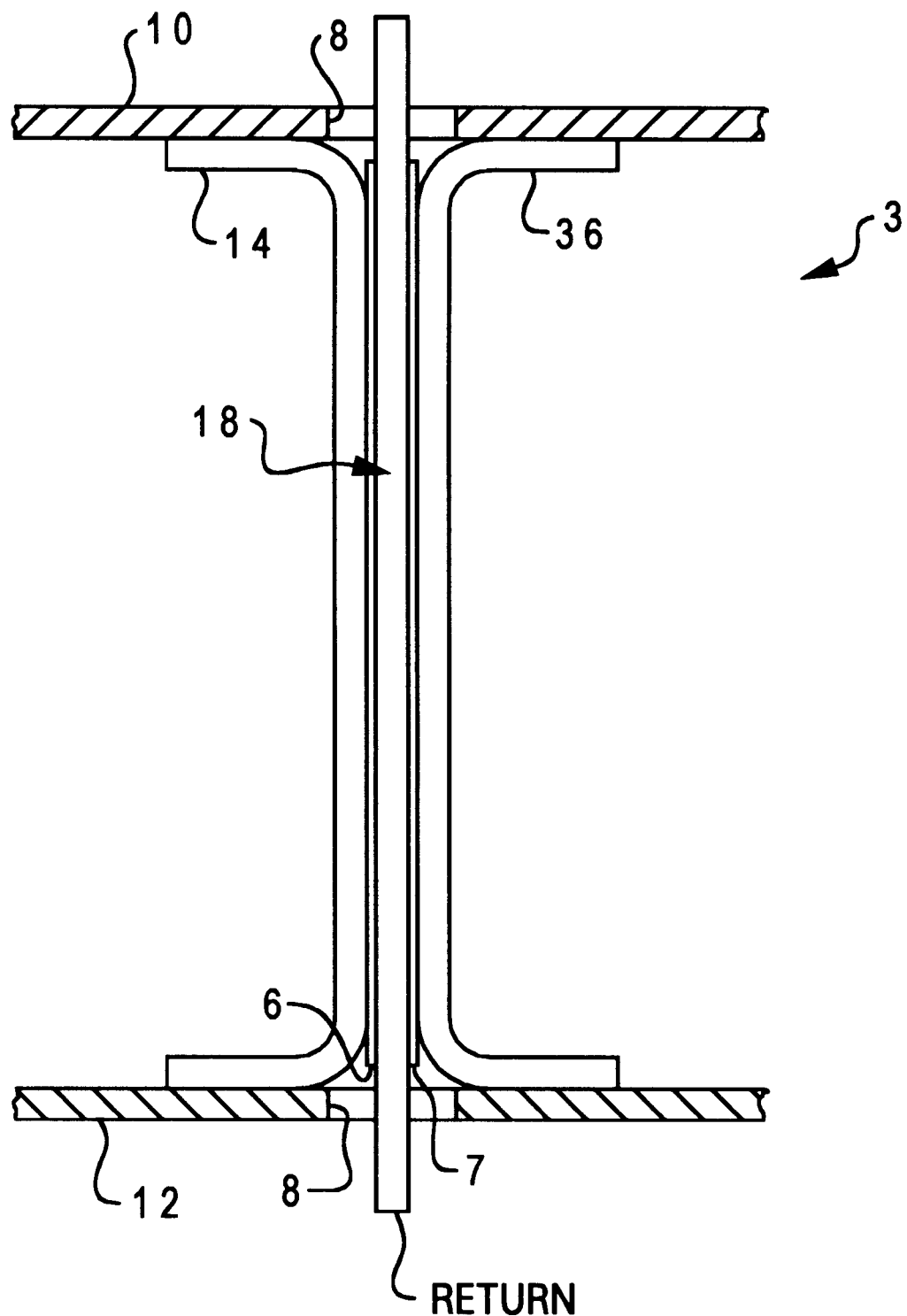
FIG. 2 is a side elevational view illustrating another embodiment of a low impedance power distribution interconnect in accordance with the present invention.

Referring to FIG. 2, a side elevational view illustration of a dual sided low impedance interconnect is depicted in accordance with the present invention. In FIGS. 1 and 2 like elements are referred to utilizing like reference numerals. Although FIGS. 1 and 2 both illustrate a horizontal configuration of two CIMs, a vertical configuration of CIMs would perform equally as well. Additionally, stacking of three or more CIMs could be accomplished in accordance with the present invention.

Third conductor 36 is illustrated rotated 180 degrees from first conductor 14 and separated therefrom by conductive structure 18, first insulator 6 and second insulator 7.

Prior to assembly of first CIM 10 to second CIM 12, a sub-assembly comprised of first conductor 14, third conductor 36, first insulator 6, conductive structure 18 and second insulator 7 can be manufactured. As first CIM 10 and second CIM 12 are placed together, tabs 26 on each edge of conductive structure 18 are inserted into plated through holes 8 of first CIM 10 and second CIM 12.

The illustrated configuration can be placed in a fixture to secure a relationship between mechanical elements of the invention prior to a soldering assembly process. The present invention allows hundreds of connections to be simultaneously soldered in a single automated operation.

The elements described above interconnecting first CIM 10 and second CIM 12 provide power transmission with a controlled impedance. However, the exact impedance will vary slightly with mechanical tolerances in the physical implementation of the invention. More specifically, a low impedance high current interconnect can be achieved between first CIM 10 and second CIM 12 when an insulator having a high dielectric constant is chosen.

While the invention has been particularly shown and described with reference to a preferred embodiment, it will be understood by those skilled in the art that various changes in form and detail may be made therein without departing from the spirit and scope of the invention.

What is claimed is:

1. An apparatus for electrically connecting component interconnect modules (CIMs) using controlled impedance transmission lines, comprising:

a first conductive member having a first surface, a second surfaces, and a third generally planar surface, wherein said first surface electrically connects to a first CIM and said second surface for electrically connects to a second CIM;

at least one insulative sheet having dielectric properties, said insulative sheet aligned parallel to and positioned in close proximity to said third planar surface of said first conductive member; and a planar conductive structure aligned parallel to and opposing said third generally planar surface of said first conductive member, such that an impedance between said first CIM and said second CIM is controlled and a low impedance high current interconnect is achieved between said first CIM and said second CIM in conformity with said dielectric properties of said at least one insulative sheet.

2. The apparatus according to claim 1, wherein said first conductive member is C-shaped.

3. The apparatus according to claim 1, wherein said conductive structure is a flat sheet having tabs.

4. The apparatus according to claim 1, wherein said first CIM is a printed circuit board.

5. The apparatus according to claim 1, wherein said second CIM is a printed circuit board.

6. The apparatus according to claim 1, wherein said first conductive member provides a low controlled inductance.

7. The apparatus according to claim 1, further comprising a second conductive member having a fourth surface, a fifth surface and a sixth planar surface, said fourth surface for electrically connecting to said first CIM, and said fifth surface for electrically connecting to said second CIM, wherein said sixth planar surface is aligned parallel to said conductive structure, such that an impedance between said first CIM and said second CIM is controlled and a low impedance high current interconnect is achieved between said first CIM and said second CIM in conformity with said dielectric properties of said at least one insulative sheet.

8. The apparatus according to claim 7, wherein said first conductive member is for providing a power path and said second conductive member is for providing a return path.

9. The apparatus according to claim 7, wherein said first conductive member and said second conductive member are positioned on the same side of said conductive structure.

10. The apparatus according to claim 7, wherein said first conductive member and said second conductive member are positioned on opposite sides of said conductive structure, and wherein said at least one insulative sheet comprises a second insulative sheet positioned between said second conductive member and said conductive structure.

11. The apparatus according to claim 1, wherein said first conductive member is inserted into a through hole in said first CIM.

12. The apparatus according to claim 1, wherein said first conductive member is inserted into a through hole in said second CIM.

13. The apparatus according to claim 1, wherein said first CIM is a power supply circuit board and said second CIM is a digital signal processing CIM.

14. The apparatus according to claim 1, wherein said first conductive member is secured utilizing a soldering process.

15. The apparatus according to claim 14, wherein said soldering process is a surface mount soldering process.

16. The apparatus according to claim 1, wherein said insulative sheet has a dielectric constant of approximately 9.

17. A low impedance high current interconnect for interfacing CIMs comprising:

a first circuit board having a first mount pad and a second mount pad;

a second circuit board having a third mount pad and a fourth mount pad;

a first sheet member electrically interconnecting said first mount pad of said first circuit board to said third mount pad of said second circuit board, said first member for carrying a current to said first circuit board;

a second sheet member mounted in close proximity and parallel to said first member, said second member electrically interconnecting said second mount pad of said first circuit board to said fourth mount pad of said second circuit board, said second member for carrying a current from said first circuit board; and a sheet insulator placed parallel to and between said first member and said second member providing a dielectric material between said first member and said second member to provide a low impedance high current interconnect between said first circuit board and said second circuit board.

18. A method for interconnecting CIMs with a low impedance high current path comprising the steps of:

securing a first CIM to a first conductor and a conductive structure;

securing a second CIM to said first conductor line and said conductive structure; and placing an insulative sheet between said first conductor and said conductive structure wherein said first conductor, said conductive structure and said insulative sheet are secured in close proximity in a parallel arrangement to provide a low impedance high current transmission line between said first CIM and said second CIM.

19. The method according to claim 18, further comprising the step of forming said first conductor into a C-shape.

20. The method according to claim 18, further comprising the step of forming tabs on said conductive structure.

21. The method according to claim 18, further comprising the step of securing said insulative sheet to said first conductor.

22. The method according to claim 18, further comprising the step of securing said insulative sheet to said conductive structure.

23. The method according to claim 18, wherein said insulative sheet, said first conductor and said conductive structure provide an interconnect inductance of no more than 1 nanohenry.

24. The method according to claim 18, further comprising the step of soldering said first conductor and said conductive structure to said first and said second CIM.

25. The method according to claim 18, wherein said first CIM is for supplying power and said second CIM is for digital signal processing.

* * * * *